United States Patent
Nagamine

(10) Patent No.: US 11,581,033 B2
(45) Date of Patent: Feb. 14, 2023

(54) SUB-SENSE AMPLIFIER LAYOUT SCHEME TO REDUCE AREA

(71) Applicant: Powerchip Semiconductor Manufacturing Corporation, Hsinchu (TW)

(72) Inventor: Hisayuki Nagamine, Tokyo (JP)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 43 days.

(21) Appl. No.: 17/342,565

(22) Filed: Jun. 9, 2021

(65) Prior Publication Data

US 2022/0399051 A1 Dec. 15, 2022

(51) Int. Cl.
| | |
|---|---|
| G11C 7/06 | (2006.01) |
| G11C 11/4091 | (2006.01) |
| G11C 11/408 | (2006.01) |
| G11C 7/10 | (2006.01) |
| G11C 11/22 | (2006.01) |

(52) U.S. Cl.
CPC .......... *G11C 11/4091* (2013.01); *G11C 7/06* (2013.01); *G11C 7/065* (2013.01); *G11C 7/1039* (2013.01); *G11C 11/4087* (2013.01); G11C 11/2273 (2013.01)

(58) Field of Classification Search
CPC .......... G11C 11/4085; G11C 11/4094; G11C 11/408; G11C 11/4087; G11C 11/4074; G11C 8/14
See application file for complete search history.

(56) References Cited

U.S. PATENT DOCUMENTS 6,127,853 A * 10/2000 Yu ........................... G11C 7/067
327/55
6,229,745 B1 * 5/2001 Nambu ..................... G11C 7/06
365/207

(Continued)

FOREIGN PATENT DOCUMENTS

TW 202025149 7/2020

OTHER PUBLICATIONS

"Notice of allowance of Taiwan Counterpart Application", dated Jul. 29, 2022, p. 1-p. 5.

*Primary Examiner* — Mushfique Siddique
(74) *Attorney, Agent, or Firm* — JCIPRNET

(57) ABSTRACT

A sub-sense amplifier includes a semiconductor substrate, a first pair of complementary transistors, a second pair of complementary transistors, and at least one ground transistor. The first pair and second pair of complementary transistors and the ground transistor are formed on the semiconductor substrate. The first pair of complementary transistors are disposed in line symmetry with a center line of the sub-sense amplifier as a symmetry axis, and gates of the first pair of complementary transistors are coupled to a node. The second pair of complementary transistors are also disposed in line symmetry with the center line, wherein the current directions of the second pair of complementary transistors are the same. Sources and drains of the first pair of complementary transistors are coupled to gates and sources of the second pair of complementary transistors, respectively. The ground transistor connects in series with the second pair of complementary transistors.

18 Claims, 15 Drawing Sheets

(56) References Cited

U.S. PATENT DOCUMENTS

| | | | |
|---|---|---|---|
| 6,243,314 B1 * | 6/2001 | Seol | G11C 7/065 |
| | | | 365/189.11 |
| 6,700,169 B2 | 3/2004 | Kuroki | |
| 2001/0005325 A1 | 6/2001 | Kitayama et al. | |
| 2001/0015928 A1 | 8/2001 | Fujioka et al. | |
| 2005/0195672 A1 * | 9/2005 | Lee | G11C 7/04 |
| | | | 365/207 |
| 2012/0224405 A1 | 9/2012 | Tanaka et al. | |
| 2013/0301370 A1 | 11/2013 | Narui | |
| 2014/0133251 A1 * | 5/2014 | Takahashi | G11C 11/4094 |
| | | | 365/189.16 |
| 2015/0003146 A1 | 1/2015 | Chun et al. | |
| 2015/0103605 A1 | 4/2015 | Vogelsang et al. | |
| 2019/0304516 A1 * | 10/2019 | Shimizu | G11C 29/52 |

\* cited by examiner

SUB-SENSE AMPLIFIER LAYOUT SCHEME TO REDUCE AREA

BACKGROUND

Technical Field

The invention relates to a memory device layout, and particularly relates to a sub-sense amplifier and a semiconductor memory device.

Description of Related Art

DRAM (Dynamic random-access memory) is a type of random-access semiconductor memory. In general, DRAMs are equipped with multiple memory cell arrays, sub X-decoder circuits, and sense amplifier circuits. For improving operate speed, the sense amplifier circuit may include a sense amplifier and a sub-sense amplifier.

Since the sub-sense amplifier has more complicated connections, the area thereof is larger than other circuit and has an impact on the development of the miniaturization of chip size. Moreover, due to the chip cost, the larger the area of the sub-sense amplifier, the higher the cost.

SUMMARY

The invention provides a sub-sense amplifier having a small layout for cost down.

The invention further provides a semiconductor memory device to obtain good quality of sub-sense amplifier characteristics.

The sub-sense amplifier of one embodiment of the invention includes a semiconductor substrate, a first pair of complementary transistors, a second pair of complementary transistors, and at least one ground transistor. The first pair of complementary transistors are formed on the semiconductor substrate and disposed in line symmetry with a center line of the sub-sense amplifier as a symmetry axis, and gates of the first pair of complementary transistors are coupled to a node. The second pair of complementary transistors are formed on the semiconductor substrate and disposed in line symmetry with the center line of the sub-sense amplifier as the symmetry axis, wherein sources of the first pair of complementary transistors are coupled to gates of the second pair of complementary transistors, and drains of the first pair of complementary transistors are coupled to sources of the second pair of complementary transistors. The ground transistor is formed on the semiconductor substrate to connect in series with the second pair of complementary transistors. A current direction of one of the second pair of complementary transistors is the same as a current direction of another of the second pair of complementary transistors.

In an embodiment of the invention, a current direction of one of the first pair of complementary transistors is the same as a current direction of another of the first pair of complementary transistors.

In an embodiment of the invention, the at least one ground transistor is a third pair of complementary transistors, and the third pair of complementary transistors are disposed in line symmetry with the center line of the sub-sense amplifier as the symmetry axis.

In an embodiment of the invention, the sub-sense amplifier further comprises a first diffusion region and a second diffusion region formed in the semiconductor substrate. One of the first pair of complementary transistors and one of the second pair of complementary transistors are placed in the first diffusion region, and another of the first pair of complementary transistors and another of the second pair of complementary transistors are placed in the second diffusion region.

In an embodiment of the invention, the first diffusion region is isolated from the second diffusion region.

In an embodiment of the invention, the first pair of complementary transistors and the second pair of complementary transistors are disposed between the third pair of complementary transistors in a direction vertical to the center line.

In an embodiment of the invention, a current direction of one of the third pair of complementary transistors is the same as a current direction of another of the third pair of complementary transistors.

In an embodiment of the invention, the sub-sense amplifier further comprises a third diffusion region formed in the semiconductor substrate. The second pair of complementary transistors and the third pair of complementary transistors are placed in the third diffusion region.

In an embodiment of the invention, the second pair of complementary transistors and the third pair of complementary transistors are disposed between the first pair of complementary transistors in a direction vertical to the center line.

In an embodiment of the invention, the at least one ground transistor is a single transistor.

In an embodiment of the invention, the sub-sense amplifier further comprises a fourth diffusion region formed in the semiconductor substrate. The second pair of complementary transistors and the single transistor are placed in the fourth diffusion region.

In an embodiment of the invention, the second pair of complementary transistors and the single transistor are disposed between the first pair of complementary transistors in a direction vertical to the center line.

In an embodiment of the invention, the sub-sense amplifier further comprises a plurality of contacts and a plurality of wirings for interconnection.

In an embodiment of the invention, a number of the plurality of contacts for connecting the source of one of the first pair of complementary transistors to the gate of one of the second pair of complementary transistors is the same as a number of the plurality of contacts for connection the source of another of the first pair of complementary transistors to the gate of another of the second pair of complementary transistors.

In an embodiment of the invention, a number of the plurality of contacts for connecting the drain of one of the first pair of complementary transistors to the source of one of the second pair of complementary transistors is the same as a number of the plurality of contacts for connecting the drain of another of the first pair of complementary transistors to the source of another of the second pair of complementary transistors.

In an embodiment of the invention, a resistance of the plurality of wirings for connecting the source of one of the first pair of complementary transistors to the gate of one of the second pair of complementary transistors is the same as a resistance of the plurality of wirings for connection the source of another of the first pair of complementary transistors to the gate of another of the second pair of complementary transistors.

In an embodiment of the invention, a resistance of the plurality of wirings for connecting the drain of one of the first pair of complementary transistors to the source of one of the second pair of complementary transistors is the same as a resistance of the plurality of wirings for connecting the drain of another of the first pair of complementary transistors to the source of another of the second pair of complementary transistors.

The semiconductor memory device of another embodiment of the invention includes a plurality of memory cell arrays, a first sense amplifier, a second sense amplifier, a sense amplifier driver, and the sub-sense amplifier in above embodiment. Each of the memory cell arrays has a pair of first sides and a pair of second sides opposite to each other. The first sense amplifier and the second sense amplifier are arranged in a first direction close to the first side of the memory cell array, wherein the first direction is parallel to the first side. The sense amplifier driver is arranged between the first sense amplifier and the second sense amplifier, wherein the sense amplifier driver has a width parallel to a second direction, the second direction is vertical to the first direction. The sub-sense amplifier is arranged beside the sense amplifier driver between the first sense amplifier and the second sense amplifier, wherein the sub-sense amplifier has a width the same as the width of the sense amplifier driver, and a center line of the sub-sense amplifier is parallel to the second direction.

In another embodiment of the invention, the semiconductor memory device further comprises a sub X-decoder arranged in the second direction close to the second side of the memory cell array.

In another embodiment of the invention, the width of the sense amplifier driver is a minimum space defined by a design rule.

Based on the above, since the invention provides a sub-sense amplifier with the same current direction of the complementary transistors, the delay in read operation or malfunction can be avoided, and a good quality of sub-sense amplifier characteristics can be obtained.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
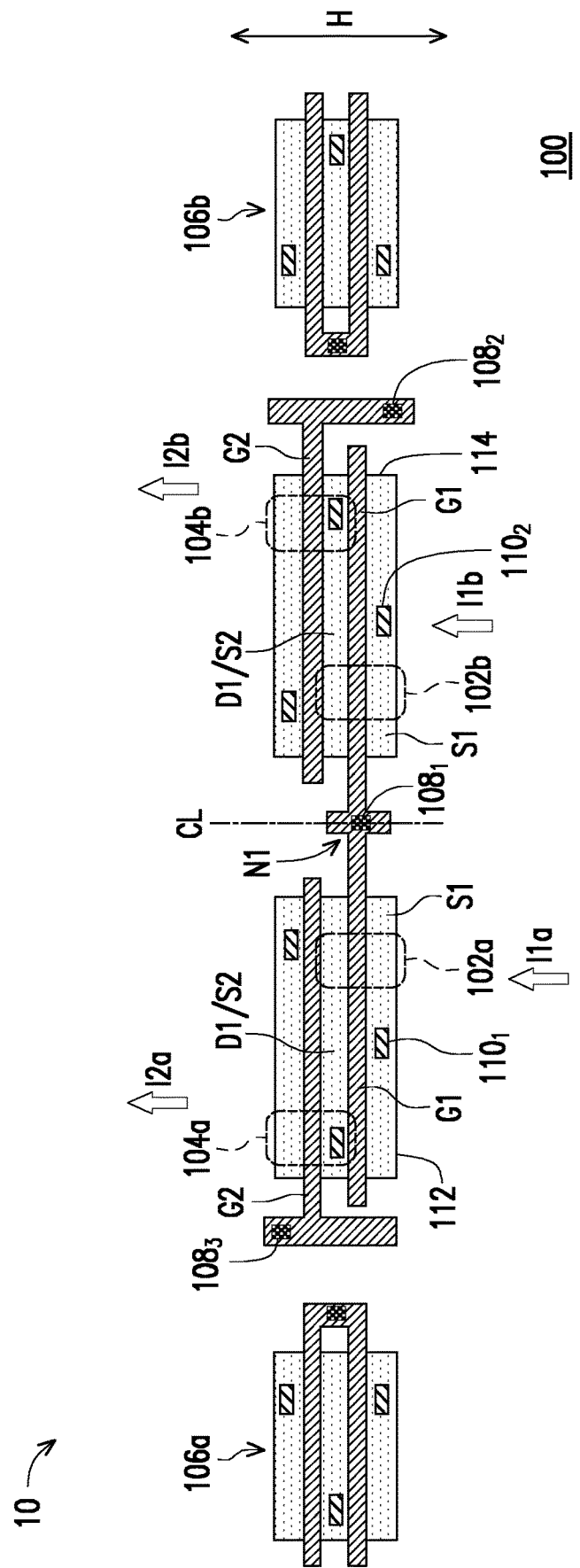
FIG. 1A is a schematic top view of a sub-sense amplifier according to a first embodiment of the invention.

Referring to the embodiments below and the accompanied drawings for a sufficient understanding of the invention. These embodiments are described in sufficient detail to enable those skilled in the art to practice the invention. However, the invention may be implemented in many other different forms and should not be construed as limited to the embodiments described hereinafter. Other embodiments may be utilized and structural, logical, and electrical changes may be made without departing from the scope of the present invention. In the drawings, for clarity, the elements and relative dimensions thereof may not be scaled. For easy understanding, the same elements in the following embodiments will be denoted by the same reference numerals.

FIG. 1A is a schematic top view of a sub-sense amplifier according to a first embodiment of the invention.

Referring to FIG. 1A, the sub-sense amplifier 10 includes a semiconductor substrate 100, a first pair of complementary transistors 102a and 102b, a second pair of complementary transistors 104a and 104b, and at least one ground transistor, wherein the at least one ground transistor is, for example, a third pair of complementary transistors 106a and 106b. The first pair of complementary transistors 102a and 102b are formed on the semiconductor substrate 100 and disposed in line symmetry with a center line CL of the sub-sense amplifier 10 as a symmetry axis, and gates G1 of the first pair of complementary transistors 102a and 102b are coupled to a node N1 via a gate contact $108_1$, wherein the node N1 may be aligned on the center line CL. A current direction I1a of one of the first pair of complementary transistors 102a is the same as a current direction I1b of another of the first pair of complementary transistors 102b.

The second pair of complementary transistors 104a and 104b are formed on the semiconductor substrate 100 and disposed in line symmetry with the center line CL of the sub-sense amplifier 10 as the symmetry axis, and a current direction I2a of one of the second pair of complementary transistors 104a is the same as a current direction I2b of another of the second pair of complementary transistors 104b. In the first embodiment, drains D1 of the first pair of complementary transistors 102a and 102b are coupled to sources S2 of the second pair of complementary transistors 104a and 104b. The source S1 of the one of the first pair of complementary transistors 102a would be coupled to the gate G2 of the another of the second pair of complementary transistors 104b via overlying connection such as a gate contact $108_2$, a field contact $110_1$, and the connections described below. The source S1 the another of the first pair of complementary transistors 102b would be coupled to the gate G2 of the one of the second pair of complementary transistors 104a via overlying connection such as a gate contact $108_3$, a field contact $110_2$, and the connections described below. In the embodiment, the complementary transistors such as 102a and 102b, 104a and 104b, or 106a and 106b are designed to have the same timing and current capability to operate.

The third pair of complementary transistors 106a and 106b (i.e. the ground transistors) are formed on the semiconductor substrate 100 to connect in series with the second pair of complementary transistors 104a and 104b via overlying connection (not shown), and the third pair of complementary transistors 106a and 106b are also disposed in line symmetry with the center line CL of the sub-sense amplifier 10 as the symmetry axis. Therefore, all transistors containing 102a, 102b, 104a, 104b, 106a, and 106b can be formed within a range of a width H which is a minimum space defined by a design rule for the width of a sense amplifier driver (not shown).

Referring to FIG. 1A again, the sub-sense amplifier 10 further includes a first diffusion region 112 and a second diffusion region 114 in the semiconductor substrate 100, and the first diffusion region 112 is isolated from the second diffusion region 114. One of the first pair of complementary transistors 102a and one of the second pair of complementary transistors 104a are placed in the first diffusion region 112. Another of the first pair of complementary transistors 102b and another of the second pair of complementary transistors 104b are placed in the second diffusion region 114. The first diffusion region 112 and the second diffusion region 114 may be well regions, and thus both the source S1 of one of the first pair of complementary transistors 102a and the source S2 of one of the second pair of complementary transistors 104a are formed in the first diffusion region 112, and so on. The first pair of complementary transistors 102a and 102b and the second pair of complementary transistors 104a and 104b are disposed between the third pair of complementary transistors 106a and 106b in a direction vertical to the center line CL.

Figure 1B:
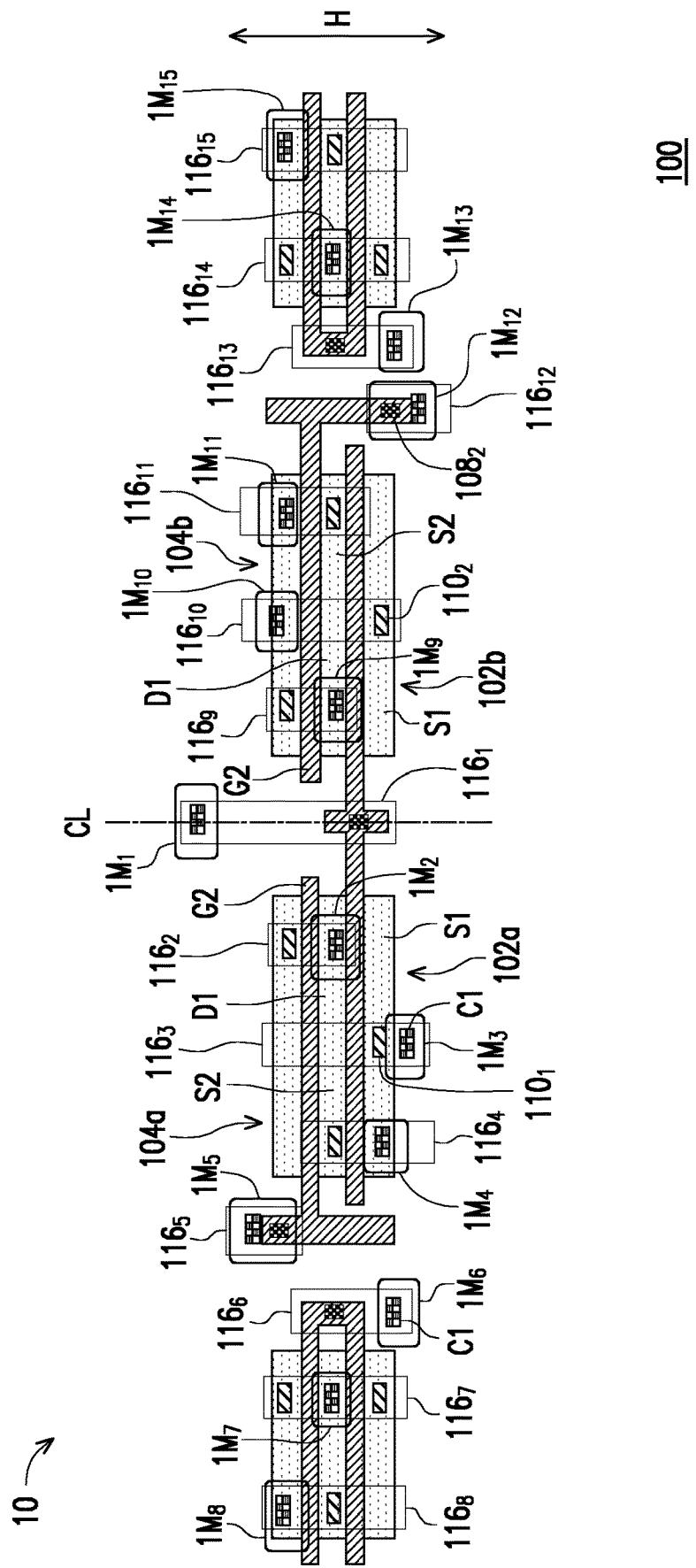
FIG. 1B is a schematic top view of the sub-sense amplifier of FIG. 1A with overlying connections.
Figure 1C:
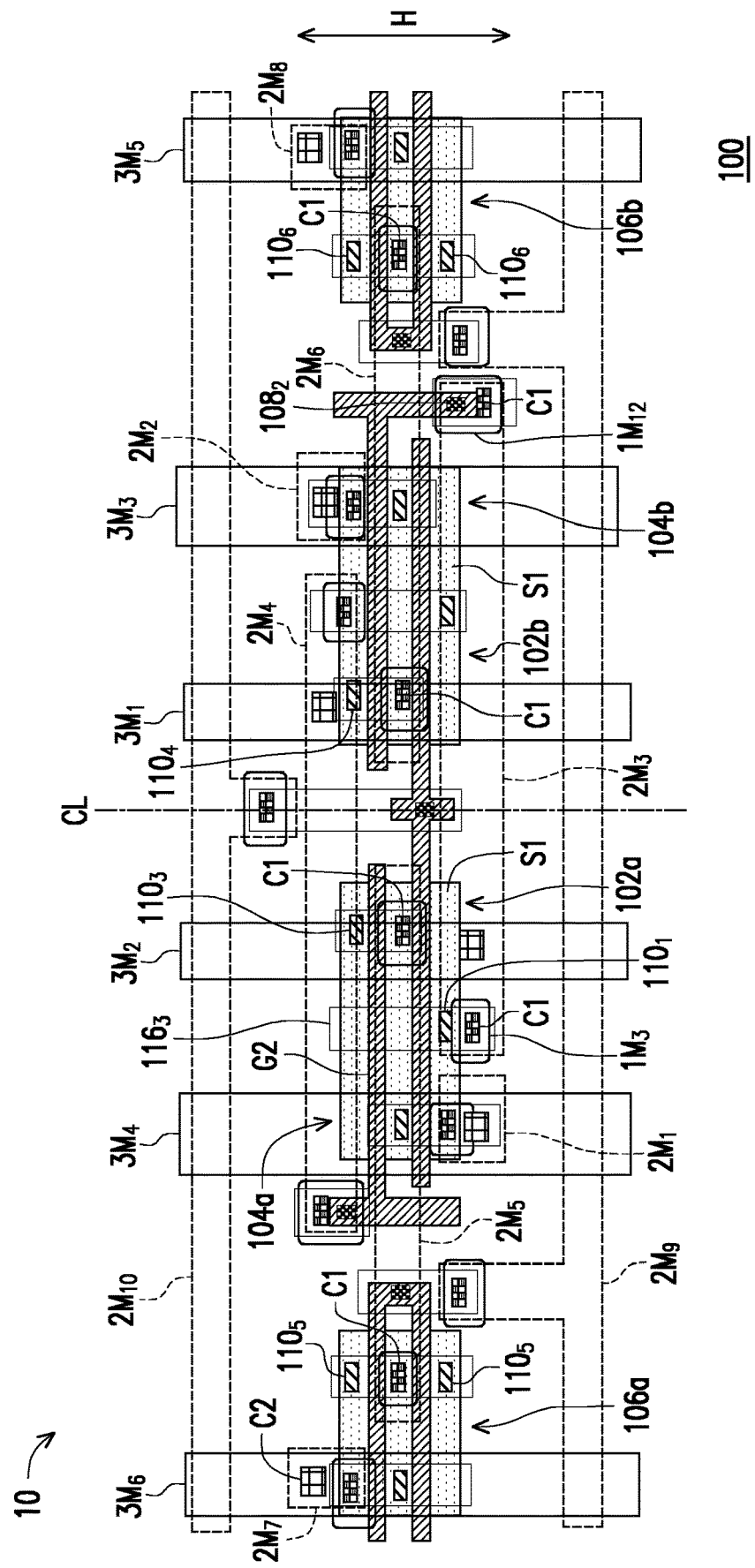
FIG. 1C is a schematic top view of the sub-sense amplifier of FIG. 1B with overlying connections.

FIG. 1B is a schematic top view of the sub-sense amplifier of FIG. 1A with overlying connections, and FIG. 1C is a schematic top view of the sub-sense amplifier of FIG. 1B with overlying connections. These two drawings are shown for clarifying the interconnections for the sub-sense amplifier of the first embodiment of the invention.

Referring to FIG. 1B, the overlying connections on the structure of FIG. 1A includes, for example, conductive lines $116_{1-15}$, first layers of metal $1M_{1-15}$, and contacts C1 for connecting the conductive lines $116_{1-15}$, the $1M_{1-15}$ and overlying layers of metal (e.g. $2M_{1-10}$ in FIG. 1C). The conductive lines $116_{1-15}$, for example, made of tungsten (W).

Referring to FIG. 1C, the overlying connections on the structure of FIG. 1B includes, for example, second layers of metal $2M_{1-10}$, third layers of metal $3M_{1-6}$, and contacts C2 for connecting the $2M_{1-10}$ and the $3M_{1-6}$. Therefore, in one example, the interconnections between the source S1 of the complementary transistor 102a and the gate G2 of the complementary transistor 104b include the field contact $110_1$, the conductive line $116_3$, one contact C1, the first layer of metal $1M_3$, the second layer of metal $2M_3$, the first layer of metal $1M_{12}$, another one contact C1, the conductive line $116_{12}$, and the gate contact $108_2$.

Figure 2:
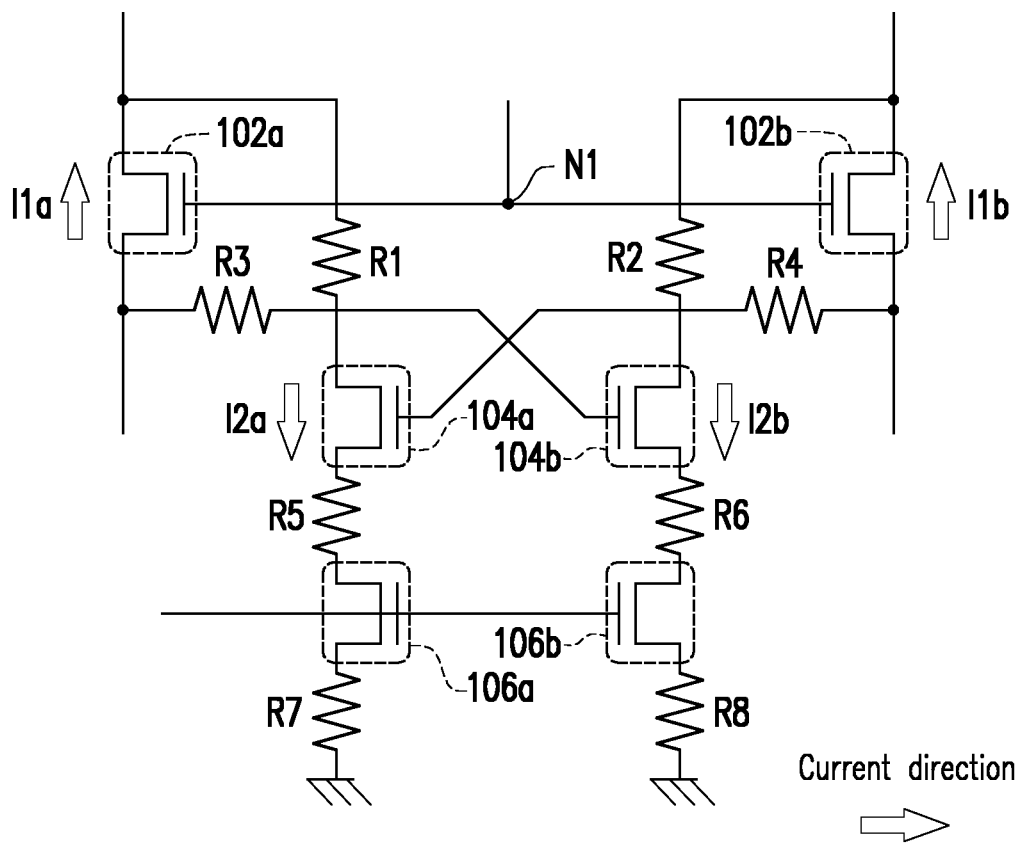
FIG. 2 is a circuit diagram of the sub-sense amplifier of FIG. 1C.

The circuit diagram of the sub-sense amplifier of FIG. 1C is illustrated in FIG. 2.

Referring to FIG. 2, in order to obtain good quality of the sub-sense amplifier 10, a quality layout with aligned resistance and current direction of the complementary transistors is required. For example, it is desired to make connection resistors R1 and R2, R3 and R4, R5 and R6, and R7 and R8 having the same value, and thus the number and/or position of contacts and the type and width of wirings can be designed to be the same. For example, in FIG. 1C, the second layers of metal $2M_5$ and $2M_6$ (i.e. the wirings) have the same type and width, and the number and/or position of contacts C1 and field contacts $110_{3-6}$ for connecting the complementary transistor 104a to the complementary transistors 106a are the same as those for connecting the complementary transistor 104b to the complementary transistor 106b, so that the connection resistors R5 and R6 are the same value. Moreover, the resistance of the wirings can be adjusted in width and length to make them the same.

Figure 1D:
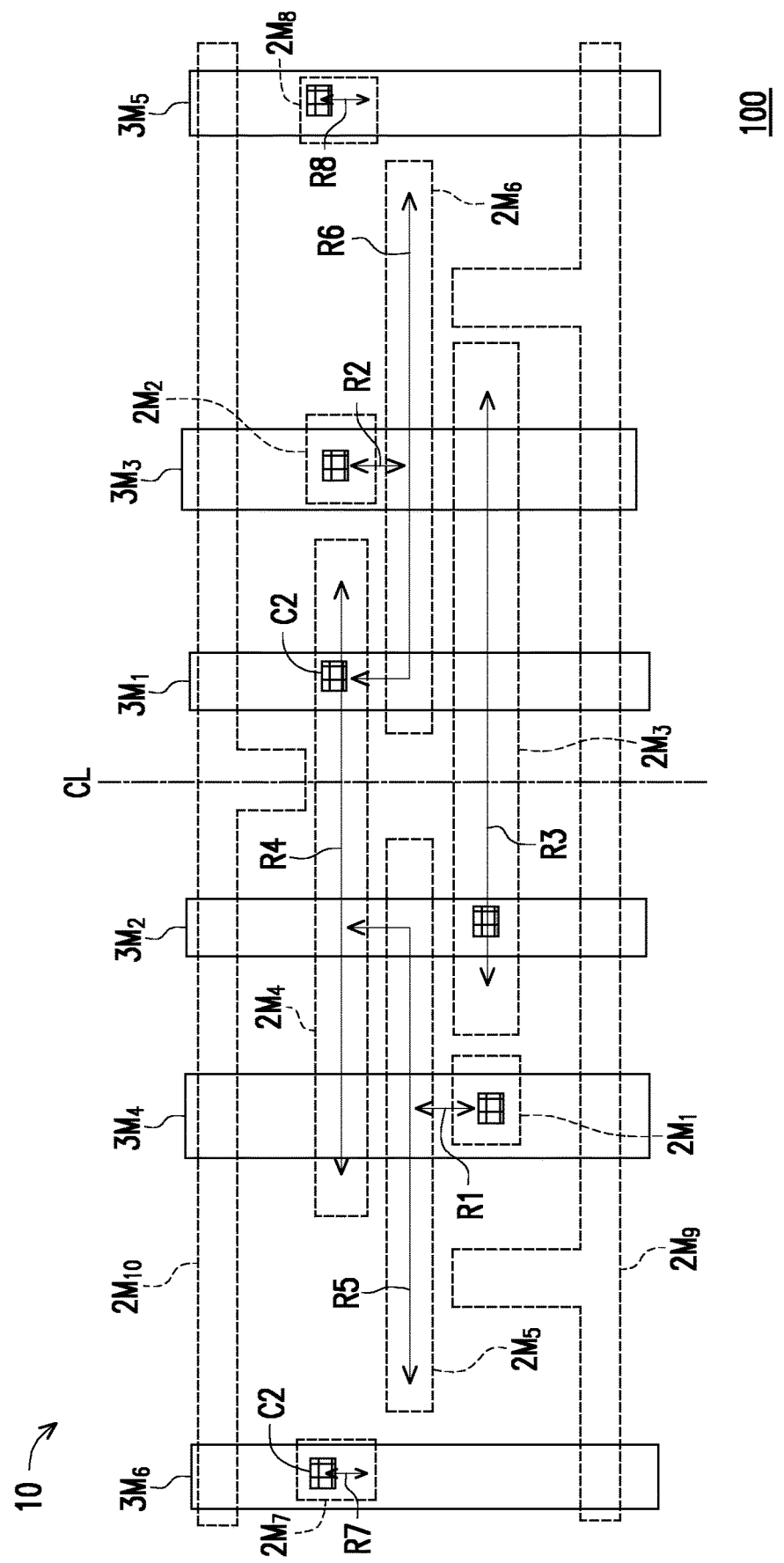
FIG. 1D is a schematic top view of the overlying connections over the sub-sense amplifier of FIG. 1B.

To clarify the relative positions of the connection resistors R1-R8 between the circuit diagram and the layout, please referring to FIG. 1D. FIG. 1D is a schematic top view of the overlying connections over the sub-sense amplifier of FIG. 1B. For instance, the connection resistor R4 is formed in the second layer of metal $2M_3$, and the second layer of metal $2M_3$ is for connecting the source S1 of the complementary transistor 102b and the gate G2 of the complementary transistor 104a, and so on.

Figure 3A:
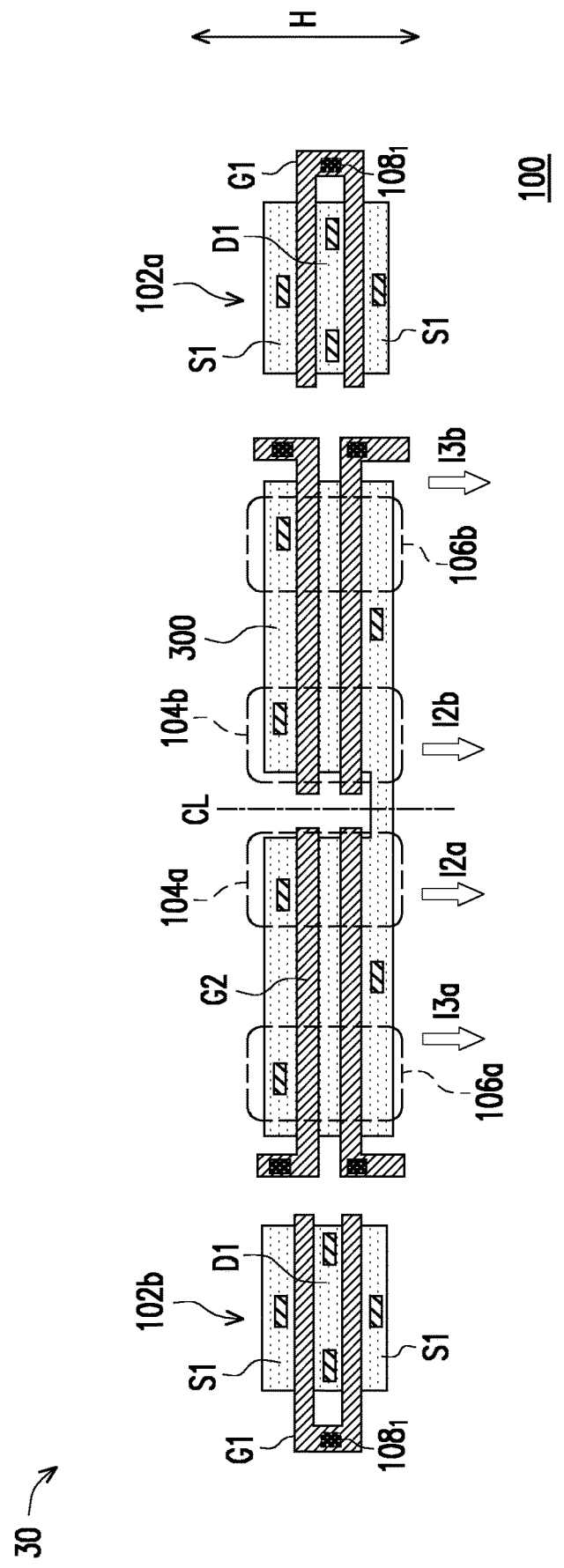
FIG. 3A is a schematic top view of a sub-sense amplifier according to a second embodiment of the invention.

FIG. 3A is a schematic top view of a sub-sense amplifier according to a second embodiment of the invention, wherein the reference symbols used in the first embodiment are used to equally represent the same or similar devices. The description of the same components can be derived from the first embodiment, and will not be repeated here.

Referring to FIG. 3A, the sub-sense amplifier 30 also includes a semiconductor substrate 100, a first pair of complementary transistors 102a and 102b, a second pair of complementary transistors 104a and 104b, and a third pair of complementary transistors 106a and 106b (i.e. the ground transistor). However, the second pair of complementary transistors 104a and 104b and the third pair of complementary transistors 106a and 106b are disposed between the first pair of complementary transistors 102a and 102b in a direction vertical to the center line CL. Accordingly, a current direction I2a of one of the second pair of complementary transistors 104a is the same as a current direction I2b of another of the second pair of complementary transistors 104b, and a current direction I3a of one of the third pair of complementary transistors 106a is the same as a current direction I3b of another of the third pair of complementary transistors 106b. The gates G1 of the first pair of complementary transistors 102a and 102b are coupled to a node (not shown) via gate contacts $108_1$ and the connections described below. In addition, the sub-sense amplifier 30 further includes a third diffusion region 300 in the semiconductor substrate 100, and the second pair of complementary transistors 104a and 104b and the third pair of complementary transistors 106a and 106b are placed in the third diffusion region 300. The third diffusion region 300 may be a well region, and thus both the sources/drains of one of the second pair of complementary transistors 104a and the sources/drains of one of the third pair of complementary transistors 106a are formed in the third diffusion region 300, and so on. In the second embodiment, the complementary transistors such as 102a and 102b, 104a and 104b, or 106a and 106b are also designed to have the same timing and current capability to operate.

Figure 3B:
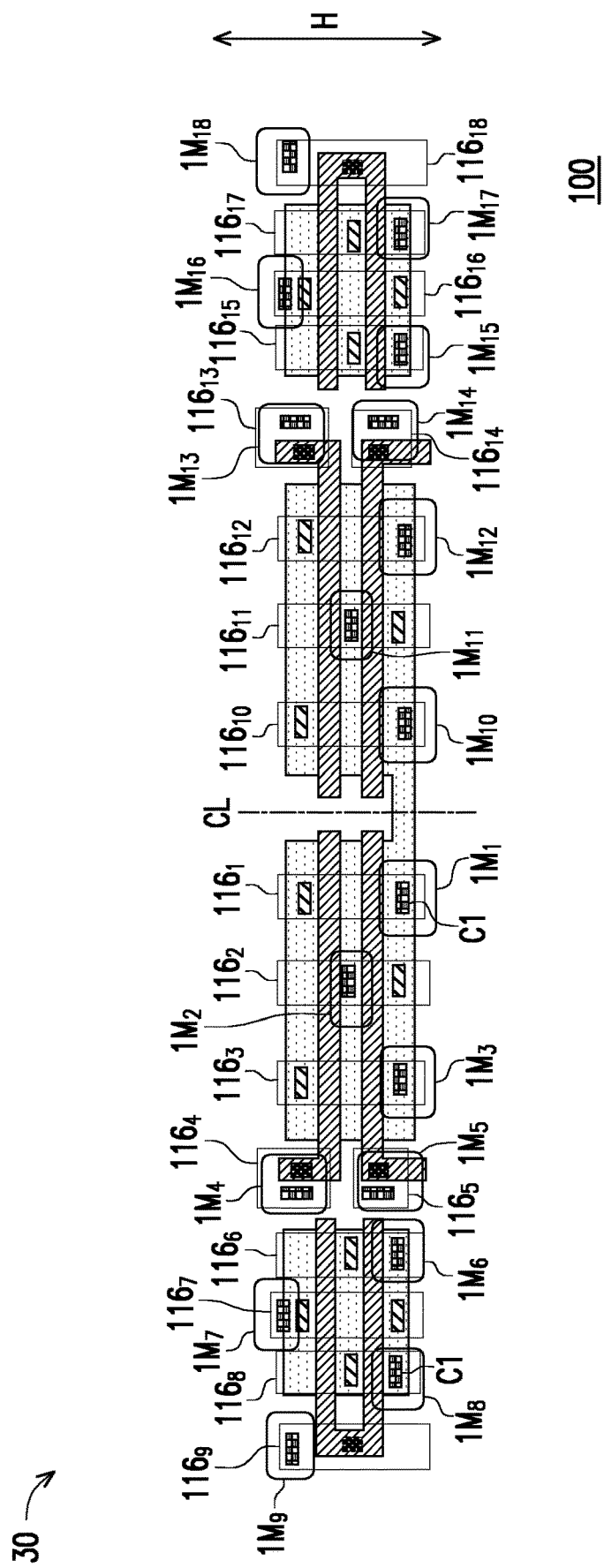
FIG. 3B is a schematic top view of the sub-sense amplifier of FIG. 3A with overlying connections.
Figure 3C:
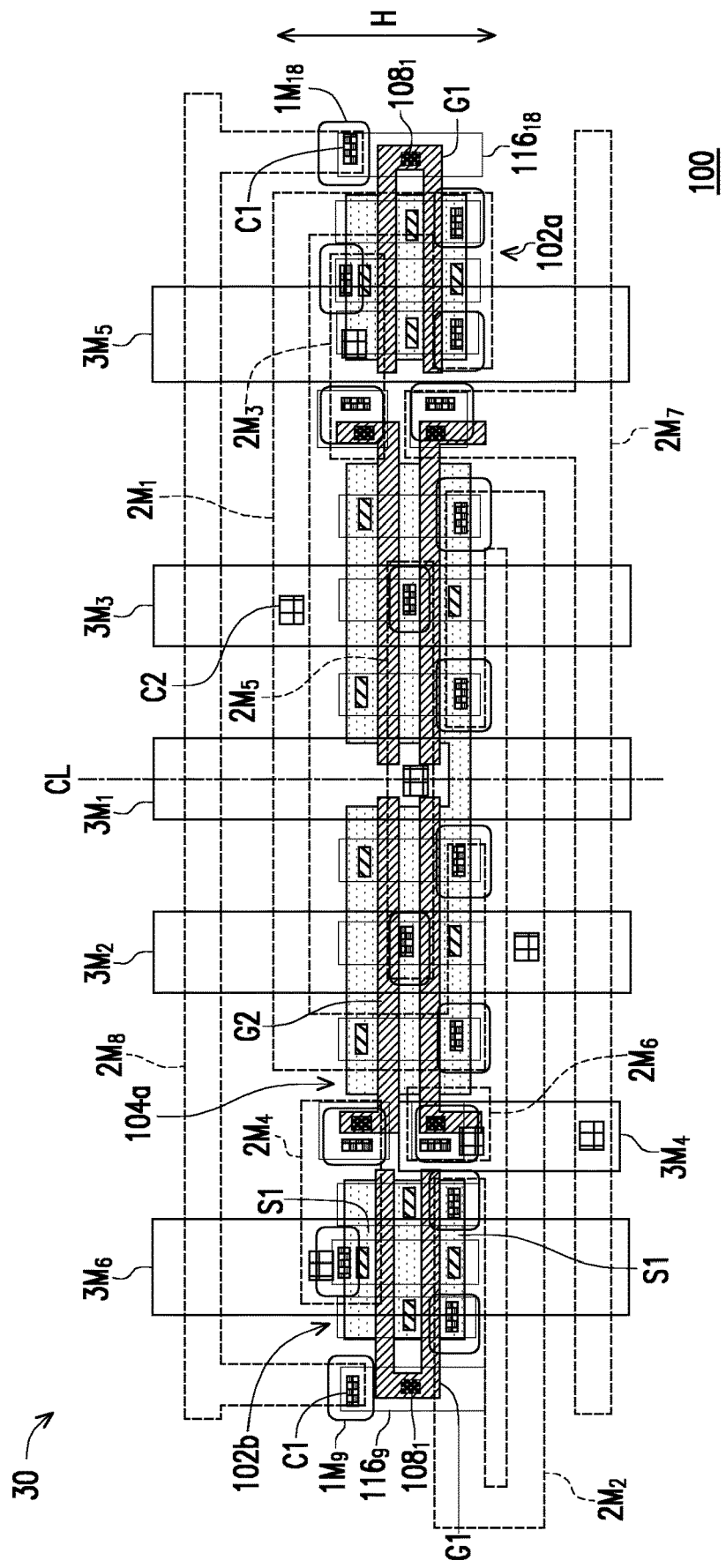
FIG. 3C is a schematic top view of the sub-sense amplifier of FIG. 3B with overlying connections.

FIG. 3B is a schematic top view of the sub-sense amplifier of FIG. 3A with overlying connections, and FIG. 3C is a schematic top view of the sub-sense amplifier of FIG. 3B with overlying connections. These two drawings are shown for clarifying the interconnections for the sub-sense amplifier of the second embodiment of the invention, and the reference symbols used in the first embodiment are used to equally represent the same or similar devices.

Referring to FIG. 3B, the overlying connections on the structure of FIG. 3A includes, for example, conductive lines $116_{1-18}$, first layers of metal $1M_{1-18}$, and contacts C1 for connecting the conductive lines $116_{1-18}$, the $1M_{1-18}$ and overlying layers of metal (e.g. $2M_{1-8}$ in FIG. 3C). The conductive lines $116_{1-18}$, for example, made of tungsten (W).

Referring to FIG. 3C, the overlying connections on the structure of FIG. 3B includes, for example, second layers of metal $2M_{1-8}$, third layers of metal $3M_{1-6}$, and contacts C2 for connecting the $2M_{1-8}$ and the $3M_{1-6}$. Therefore, the interconnections between the gates G1 of the first pair of complementary transistors 102a and 102b includes one gate contact $108_1$, the conductive lines $116_9$, one contact C1, the first layer of metal $1M_9$, the second layer of metal $2M_8$, the first layer of metal $1M_{18}$, another one contact C1, the conductive line $116_{18}$, and another one gate contact $108_1$.

Figure 3D:
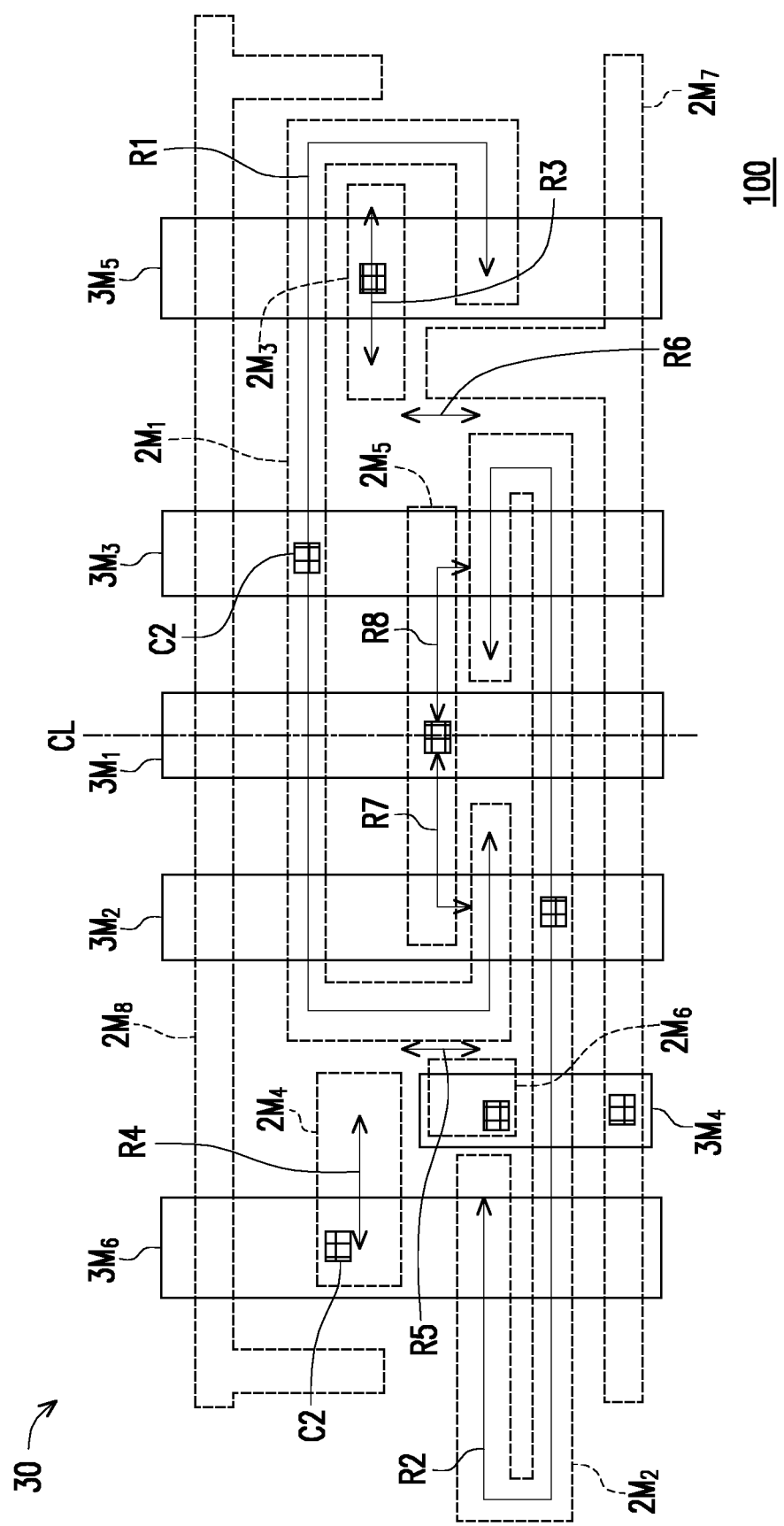
FIG. 3D is a schematic top view of the overlying connections over the sub-sense amplifier of FIG. 3B.

The circuit diagram of the sub-sense amplifier of FIG. 3C is the same as that illustrated in FIG. 2, and to clarify the relative positions of the connection resistors R1-R8 between the circuit diagram and the layout, please referring to FIG. 3D.

FIG. 3D is a schematic top view of the overlying connections over the sub-sense amplifier of FIG. 3B. For instance, the connection resistor R4 is formed in the second layer of metal $2M_4$, and the second layer of metal $2M_4$ is for connecting the source S1 of the complementary transistor 102b and the gate G2 of the complementary transistor 104a, and so on. As the first embodiment, the number and/or position of contacts and the type and width of wirings can be designed to be the same, so that the connection resistors R1 and R2, R3 and R4, R5 and R6, and R7 and R8 have the same value.

Figure 4A:
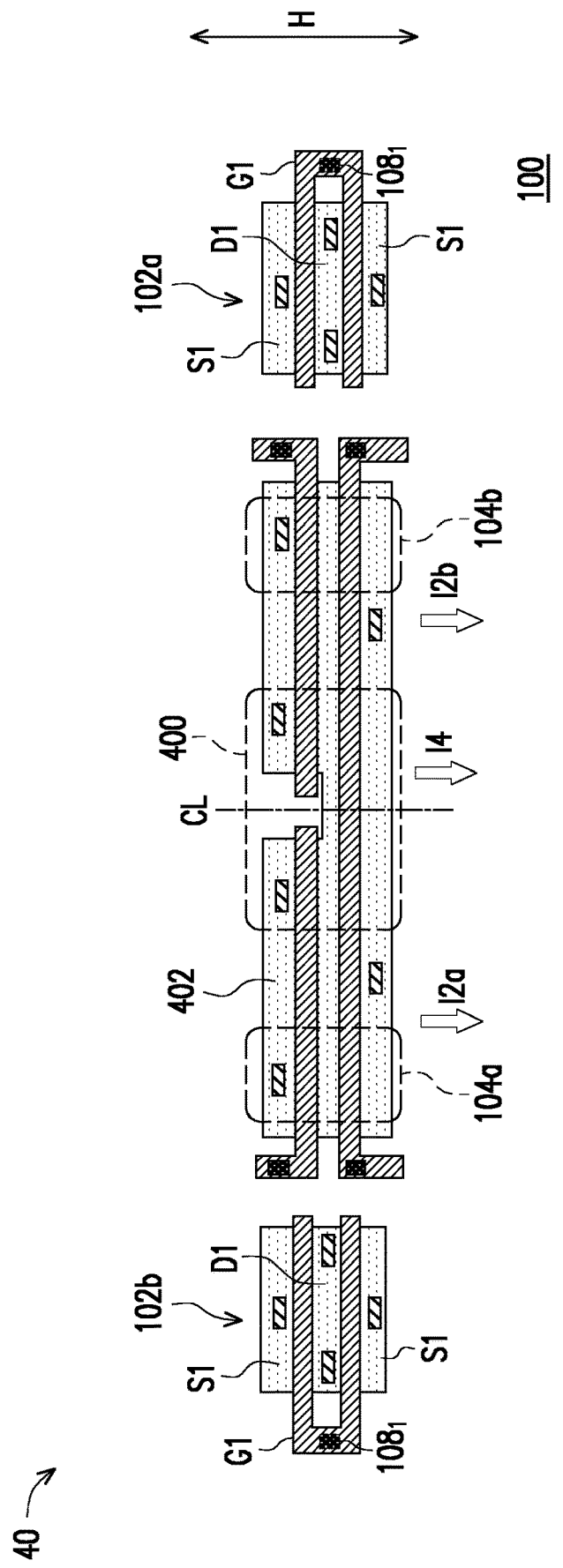
FIG. 4A is a schematic top view of a sub-sense amplifier according to a third embodiment of the invention.

FIG. 4A is a schematic top view of a sub-sense amplifier according to a third embodiment of the invention, wherein the reference symbols used in the second embodiment are used to equally represent the same or similar devices. The description of the same components can be derived from the second embodiment, and will not be repeated here.

Referring to FIG. 4A, the sub-sense amplifier 40 includes a semiconductor substrate 100, a first pair of complementary transistors 102a and 102b, a second pair of complementary transistors 104a and 104b, and a single transistor 400 as the ground transistor. The second pair of complementary transistors 104a and 104b and the single transistor 400 are disposed between the first pair of complementary transistors 102a and 102b in a direction vertical to the center line CL. The sub-sense amplifier 40 further includes a fourth diffusion region 402 in the semiconductor substrate 100, and the second pair of complementary transistors 104a and 104b and the single transistor 400 are placed in the fourth diffusion region 402. The fourth diffusion region 402 may be a well region. Since the layout of the sub-sense amplifier 40 is similar to that of the sub-sense amplifier 30, the current direction I2a of one of the second pair of complementary transistors 104a is also the same as the current direction I2b of another of the second pair of complementary transistors 104b, and a current direction I4 of the single transistor 400 is the same as the current direction I2a.

In the third embodiment, the complementary transistors such as 102a and 102b, or 104a and 104b are also designed to have the same timing and current capability to operate.

Figure 4B:
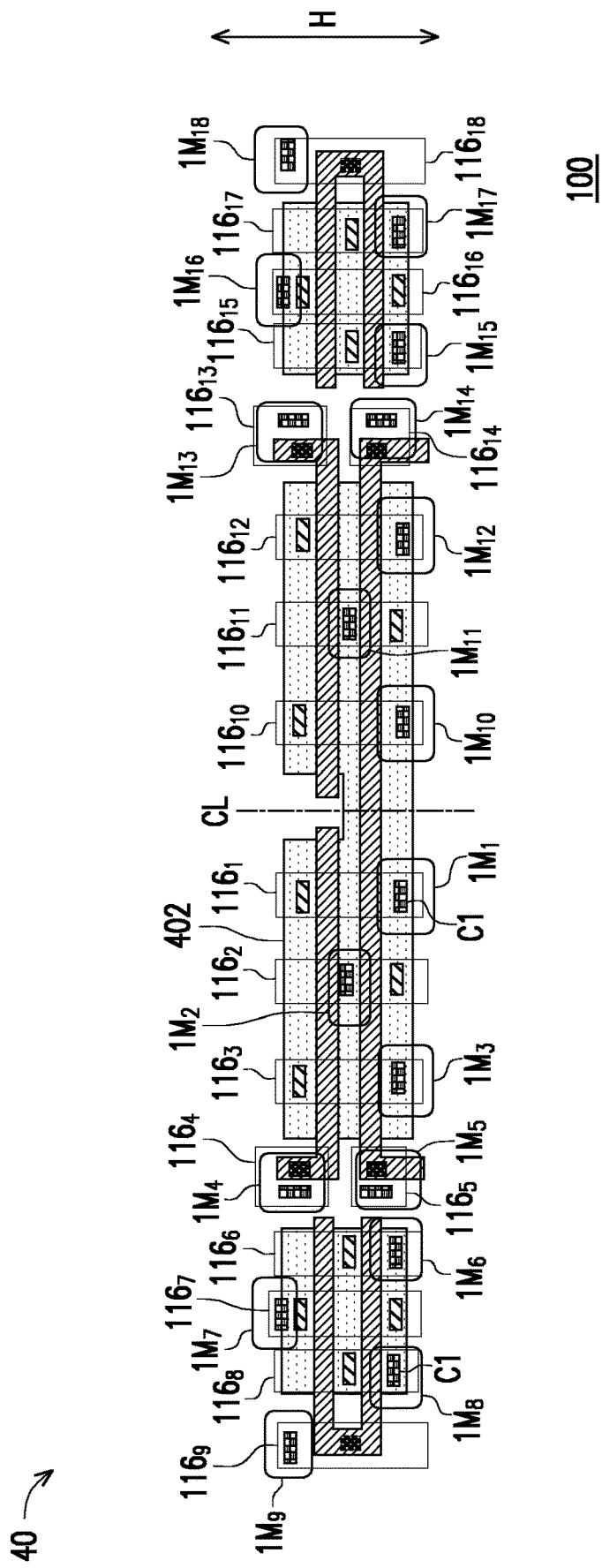
FIG. 4B is a schematic top view of the sub-sense amplifier of FIG. 4A with overlying connections.
Figure 4C:
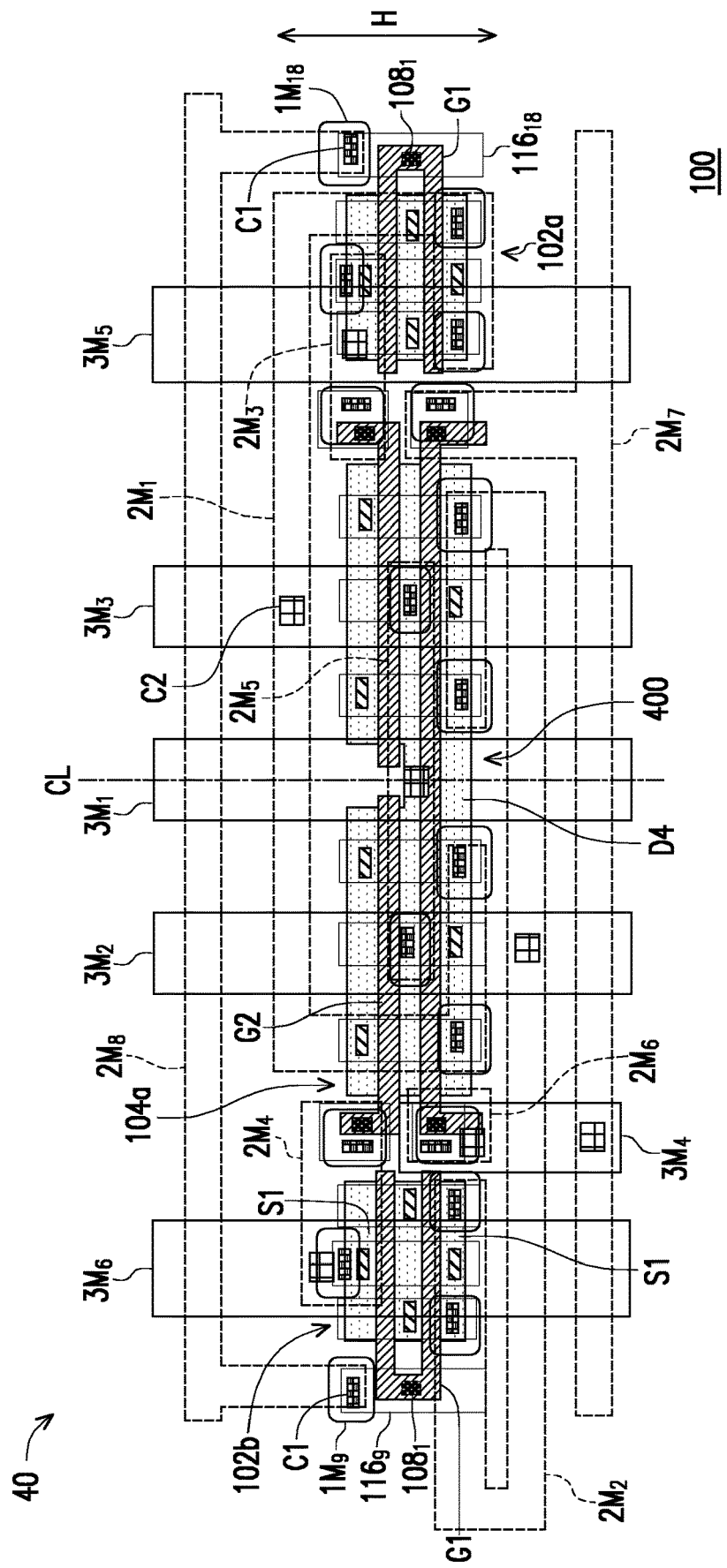
FIG. 4C is a schematic top view of the sub-sense amplifier of FIG. 4B with overlying connections.

FIG. 4B is a schematic top view of the sub-sense amplifier of FIG. 4A with overlying connections, and FIG. 4C is a schematic top view of the sub-sense amplifier of FIG. 4B with overlying connections. These two drawings are shown for clarifying the interconnections for the sub-sense amplifier of the third embodiment of the invention, and the reference symbols used in the second embodiment are used to equally represent the same or similar devices. The differences between the third embodiment and the second embodiment are the range of the fourth diffusion region 402 and the ground transistor being the single transistor 400.

Figure 4D:
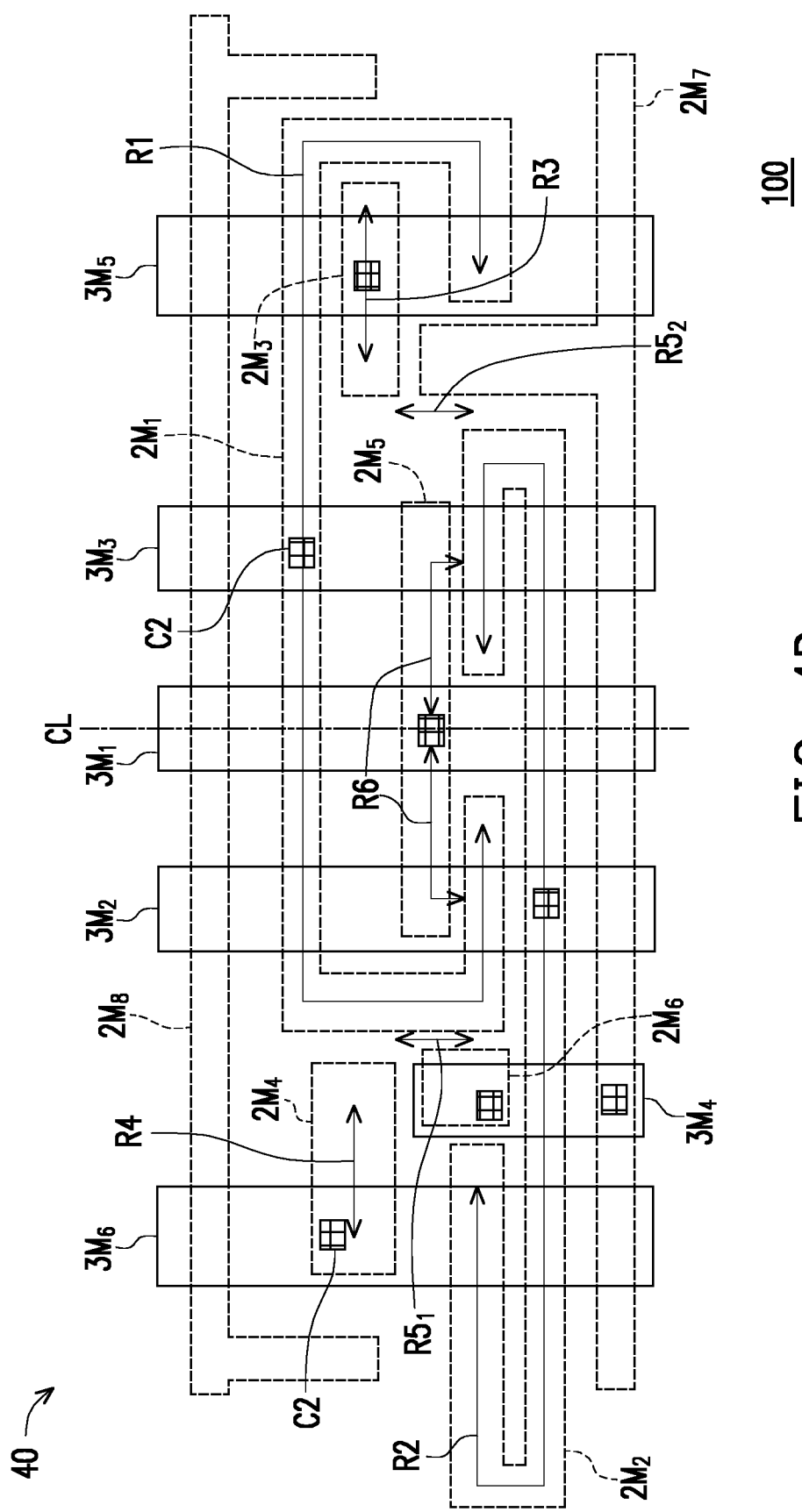
FIG. 4D is a schematic top view of the overlying connections over the sub-sense amplifier of FIG. 4B.
Figure 5:
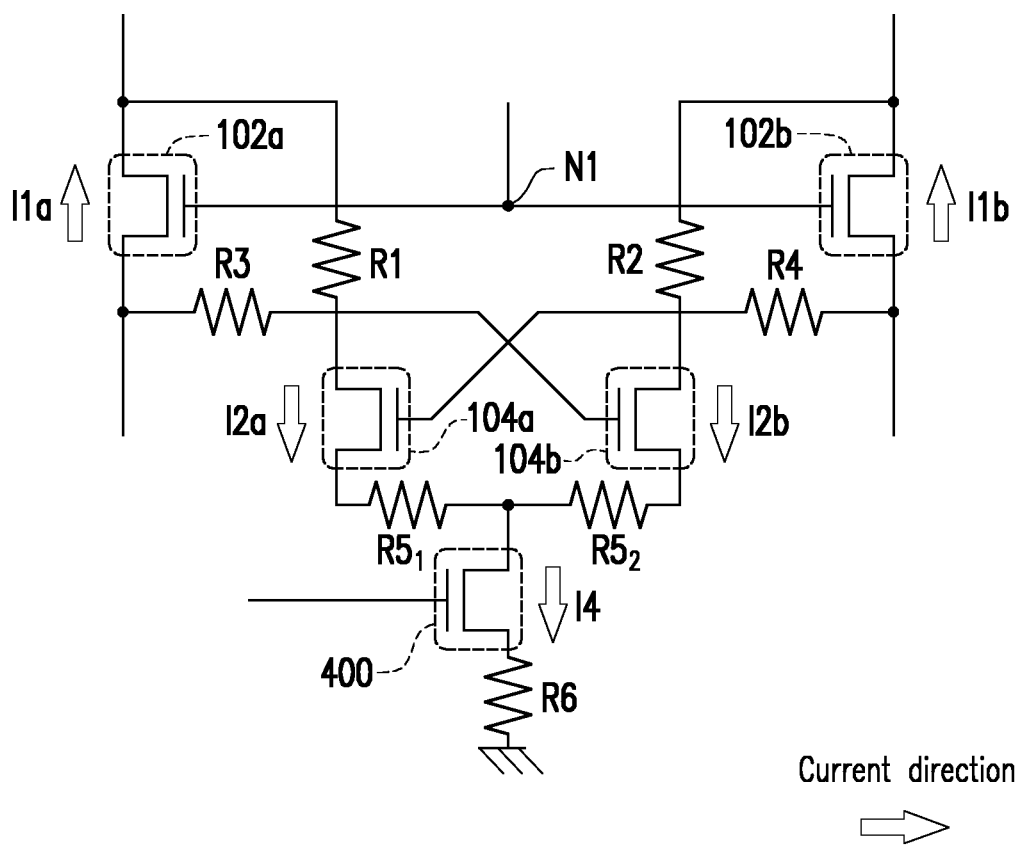
FIG. 5 is a circuit diagram of the sub-sense amplifier of FIG. 4C.

The circuit diagram of the sub-sense amplifier of FIG. 4C is illustrated in FIG. 5, and to clarify the relative positions of the connection resistors R1-R6 between the circuit diagram and the layout, please referring to FIG. 4D.

FIG. 4D is a schematic top view of the overlying connections over the sub-sense amplifier of FIG. 4B. For instance, the connection resistor R6 is formed in the second layer of metal $2M_5$, and the second layer of metal $2M_5$ is for connecting the drain D4 of the single transistor 400 to the third layer of metal $3M_1$, and so on. As the first embodiment, the number and/or position of contacts and the type and width of wirings can be designed to be the same, so that the connection resistors R1 and R2, R3 and R4, and R51 and R52 have the same value.

Figure 6:
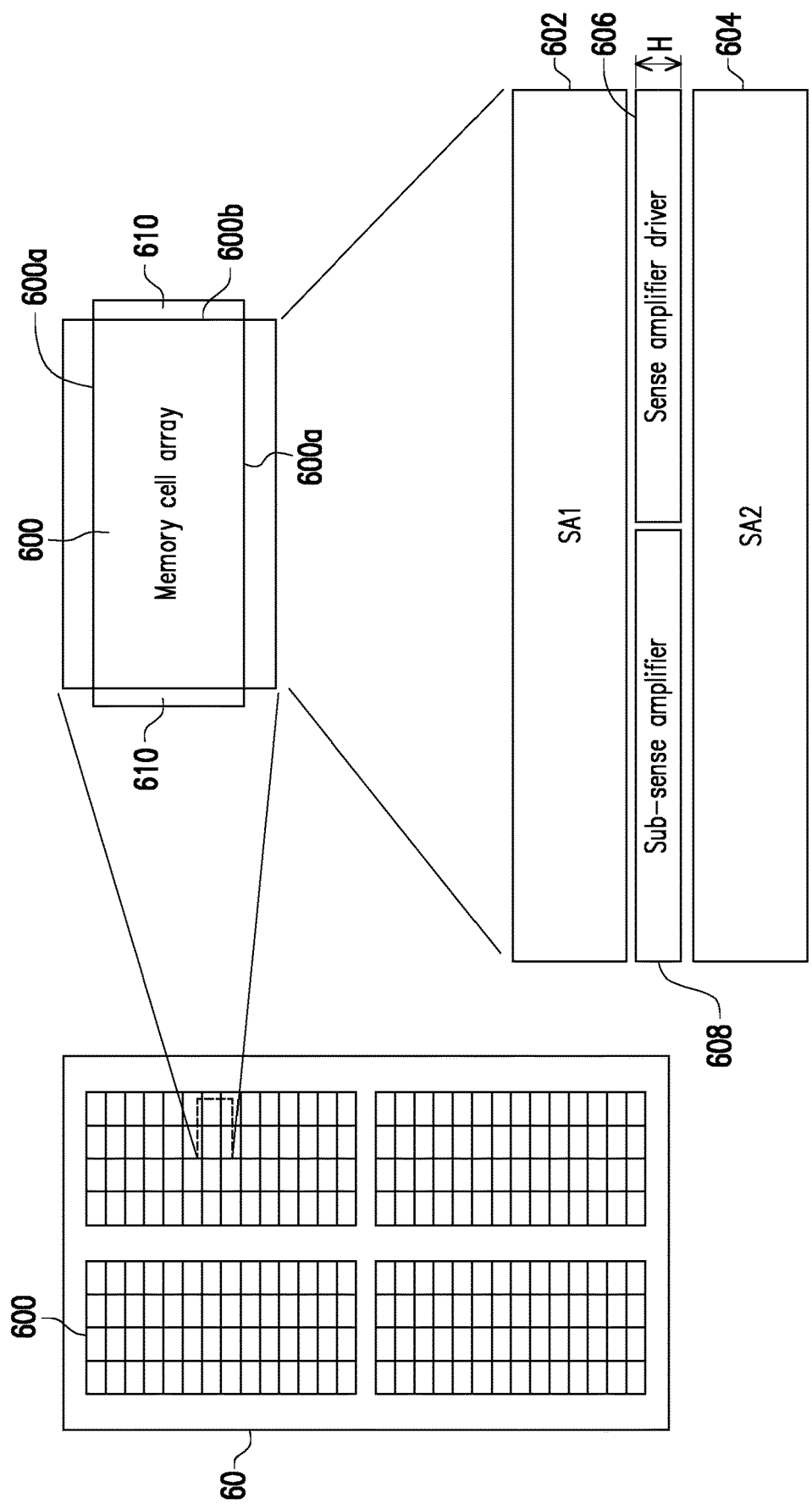
FIG. 6 is a simplified block diagram of a semiconductor memory device according to a fourth embodiment of the invention.

FIG. 6 is a simplified block diagram of a semiconductor memory device according to a fourth embodiment of the invention.

Referring to FIG. 6, a semiconductor memory device 60 includes a plurality of memory cell arrays 600, and each of the memory cell arrays 600 has a pair of first sides 600a and a pair of second sides 600b opposite to each other. The semiconductor memory device 60 further includes a first sense amplifier (SA1) 602, a second sense amplifier (SA2) 604, a sense amplifier driver 606, and a sub-sense amplifier 608, wherein the sub-sense amplifier 608 can be one of the sub-sense amplifiers of above embodiments. The first sense amplifier 602 and the second sense amplifier 604 are arranged in a first direction close to the first side 600a of the memory cell array 600, wherein the first direction is parallel to the first side 600a. The sense amplifier driver 606 is arranged between the first sense amplifier 602 and the second sense amplifier 604, wherein the sense amplifier driver 606 has a width H parallel to a second direction, the second direction is vertical to the first direction, wherein the width H of the sense amplifier driver 606 is, for example, a minimum space defined by a design rule. The sub-sense amplifier 608 is arranged beside the sense amplifier driver 606 between the first sense amplifier 602 and the second sense amplifier 604, wherein the sub-sense amplifier 608 has a width the same as the width H of the sense amplifier driver, and a center line of the sub-sense amplifier 608 is parallel to the second direction. In one embodiment, the semiconductor memory device 60 further comprises a sub X-decoder 610 arranged in the second direction close to the second side 600b of the memory cell array 600.

In summary, the sub-sense amplifier according to the invention has a width the same as the width of the sense amplifier driver, and thus the chip cost can be saved because of the small area of the sub-sense amplifier. Moreover, the sub-sense amplifier according to the invention includes complementary transistors with same current direction, even there are manufacturing variations in concentration of channel and sidewall shape, the operating speed of transistors would be kept. Therefore, the delay in read operation or malfunction can be avoided.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A sub-sense amplifier, comprising:
   a semiconductor substrate;
   a first pair of complementary transistors formed on the semiconductor substrate, the first pair of complementary transistors are disposed in line symmetry with a center line of the sub-sense amplifier as a symmetry axis, and gates of the first pair of complementary transistors are coupled to a node;
   a second pair of complementary transistors formed on the semiconductor substrate, the second pair of complementary transistors are disposed in line symmetry with the center line of the sub-sense amplifier as the symmetry axis, wherein sources of the first pair of complementary transistors are coupled to gates of the second pair of complementary transistors, and drains of the first pair of complementary transistors are coupled to sources of the second pair of complementary transistors;
   at least one ground transistor formed on the semiconductor substrate to connect in series with the second pair of complementary transistors; and
   a plurality of contacts and a plurality of wirings for interconnection,
   wherein a resistance of the plurality of wirings for connecting the source of one of the first pair of complementary transistors to the gate of one of the second pair of complementary transistors is the same as a resistance of the plurality of wirings for connection the source of another of the first pair of complementary transistors to the gate of another of the second pair of complementary transistors,
   wherein a current direction of one of the second pair of complementary transistors is the same as a current direction of another of the second pair of complementary transistors.

2. The sub-sense amplifier of claim 1, wherein a current direction of one of the first pair of complementary transistors is the same as a current direction of another of the first pair of complementary transistors.

3. The sub-sense amplifier of claim 1, wherein the at least one ground transistor is a third pair of complementary transistors, and the third pair of complementary transistors are disposed in line symmetry with the center line of the sub-sense amplifier as the symmetry axis.

4. The sub-sense amplifier of claim 3, further comprising:
   a first diffusion region in the semiconductor substrate, wherein one of the first pair of complementary transistors and one of the second pair of complementary transistors are placed in the first diffusion region; and
   a second diffusion region in the semiconductor substrate, wherein another of the first pair of complementary transistors and another of the second pair of complementary transistors are placed in the second diffusion region.

5. The sub-sense amplifier of claim 4, wherein the first diffusion region is isolated from the second diffusion region.

6. The sub-sense amplifier of claim 4, wherein the first pair of complementary transistors and the second pair of complementary transistors are disposed between the third pair of complementary transistors in a direction vertical to the center line.

7. The sub-sense amplifier of claim 3, wherein a current direction of one of the third pair of complementary transistors is the same as a current direction of another of the third pair of complementary transistors.

8. The sub-sense amplifier of claim 7, further comprising a third diffusion region in the semiconductor substrate, wherein the second pair of complementary transistors and the third pair of complementary transistors are placed in the third diffusion region.

9. The sub-sense amplifier of claim 7, wherein the second pair of complementary transistors and the third pair of complementary transistors are disposed between the first pair of complementary transistors in a direction vertical to the center line.

10. The sub-sense amplifier of claim 1, wherein the at least one ground transistor is a single transistor.

11. The sub-sense amplifier of claim 10, further comprising a fourth diffusion region in the semiconductor substrate, wherein the second pair of complementary transistors and the single transistor are placed in the fourth diffusion region.

12. The sub-sense amplifier of claim 10, wherein the second pair of complementary transistors and the single transistor are disposed between the first pair of complementary transistors in a direction vertical to the center line.

13. The sub-sense amplifier of claim 1, wherein a number of the plurality of contacts for connecting the source of one of the first pair of complementary transistors to the gate of one of the second pair of complementary transistors is the same as a number of the plurality of contacts for connection the source of another of the first pair of complementary transistors to the gate of another of the second pair of complementary transistors.

14. The sub-sense amplifier of claim 1, wherein a number of the plurality of contacts for connecting the drain of one of the first pair of complementary transistors to the source of one of the second pair of complementary transistors is the same as a number of the plurality of contacts for connecting the drain of another of the first pair of complementary transistors to the source of another of the second pair of complementary transistors.

15. The sub-sense amplifier of claim 1, wherein a resistance of the plurality of wirings for connecting the drain of one of the first pair of complementary transistors to the source of one of the second pair of complementary transistors is the same as a resistance of the plurality of wirings for connecting the drain of another of the first pair of complementary transistors to the source of another of the second pair of complementary transistors.

16. A semiconductor memory device comprising:
   a plurality of memory cell arrays, each of the memory cell arrays has a pair of first sides and a pair of second sides opposite to each other;
   a first sense amplifier and a second sense amplifier, arranged in a first direction close to the first side of the memory cell array, wherein the first direction is parallel to the first side;
   a sense amplifier driver, arranged between the first sense amplifier and the second sense amplifier, wherein the sense amplifier driver has a width parallel to a second direction, the second direction is vertical to the first direction; and
   the sub-sense amplifier of claim 1, arranged beside the sense amplifier driver between the first sense amplifier and the second sense amplifier, wherein the sub-sense amplifier has a width the same as the width of the sense amplifier driver, and a center line of the sub-sense amplifier is parallel to the second direction.

17. The semiconductor memory device of claim 16, further comprising a sub X-decoder arranged in the second direction close to the second side of the memory cell array.

18. The semiconductor memory device of claim 16, wherein the width of the sense amplifier driver is a minimum space defined by a design rule.

* * * * *